United States Patent [19]

Crowell et al.

[11] Patent Number: 4,646,436

[45] Date of Patent: Mar. 3, 1987

[54] SHIELDED INTERCONNECTION BOARDS

[75] Inventors: Jonathan C. Crowell, Lakeville, Mass.; John T. Swailes, West Islip, N.Y.

[73] Assignee: Kollmorgen Technologies Corporation, Dallas, Tex.

[21] Appl. No.: 788,961

[22] Filed: Oct. 18, 1985

[51] Int. Cl.[4] .............................................. H01K 3/10
[52] U.S. Cl. ..................................... 29/850; 174/68.5
[58] Field of Search ................... 29/850; 174/68.5, 36, 174/117 F, 117 FF; 219/121 LJ

[56] References Cited

U.S. PATENT DOCUMENTS

| | | | |
|---|---|---|---|
| 3,281,627 | 10/1966 | Fetterolf et al. | 174/68.5 |
| 3,293,353 | 12/1966 | Hendriks et al. | 174/68.5 X |
| 3,305,622 | 2/1967 | Bergsman et al. | 174/68.5 X |
| 3,465,308 | 9/1969 | Sasaki et al. | 29/850 X |
| 3,469,016 | 9/1969 | Shelton | 174/117 FF X |
| 3,499,215 | 3/1970 | Fetterolf et al. | 174/68.5 X |

OTHER PUBLICATIONS

New Miltiwire Meets the Challenge of Interconnecting Chip-Carriers *Electronics*, vol. 52, No. 26, pp. 117ff, by G. Messner et al.

Primary Examiner—Mark Rosenbaum
Assistant Examiner—Carl J. Arbes
Attorney, Agent, or Firm—Morgan & Finnegan

[57] ABSTRACT

Discloses a method for making a coaxial conductor interconnection circuit board, as well as the board per se, by providing a first conductive coating on a substrate, scribing an insulated wire signal conductor pattern on the first coating and a second conductive coating over the wire to provide a conductive shield surrounding the wire, eliminating conductive material from the coatings in clearance areas at terminal points and drilling at the terminal points by laser beam or mechanical drilling to expose the signal conductor.

8 Claims, 10 Drawing Figures

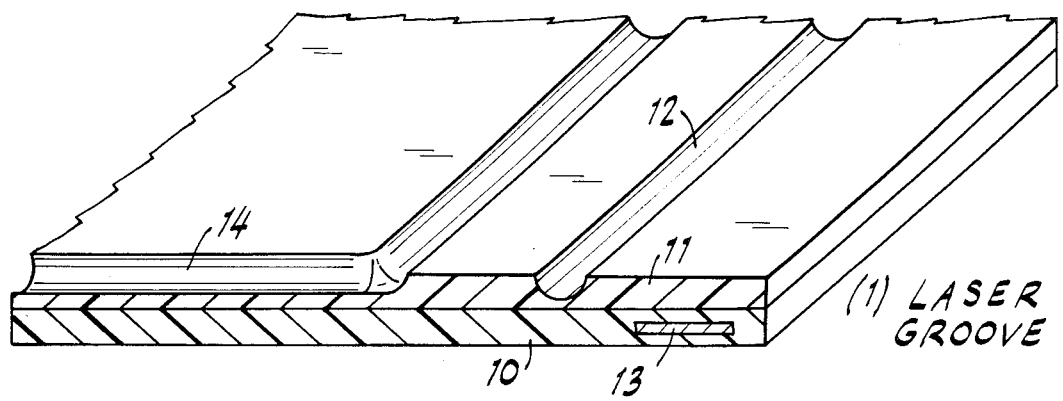
FIG. IA  (1) LASER GROOVE
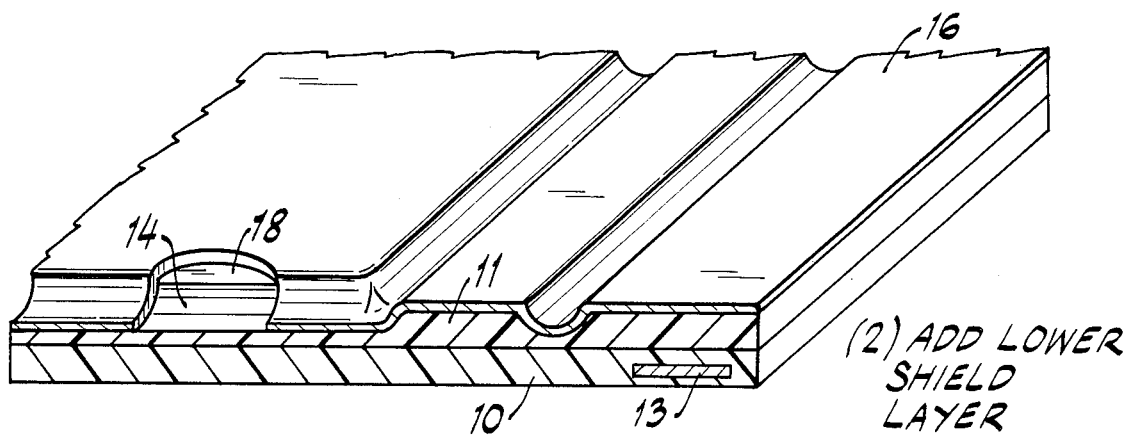
FIG. IB  (2) ADD LOWER SHIELD LAYER
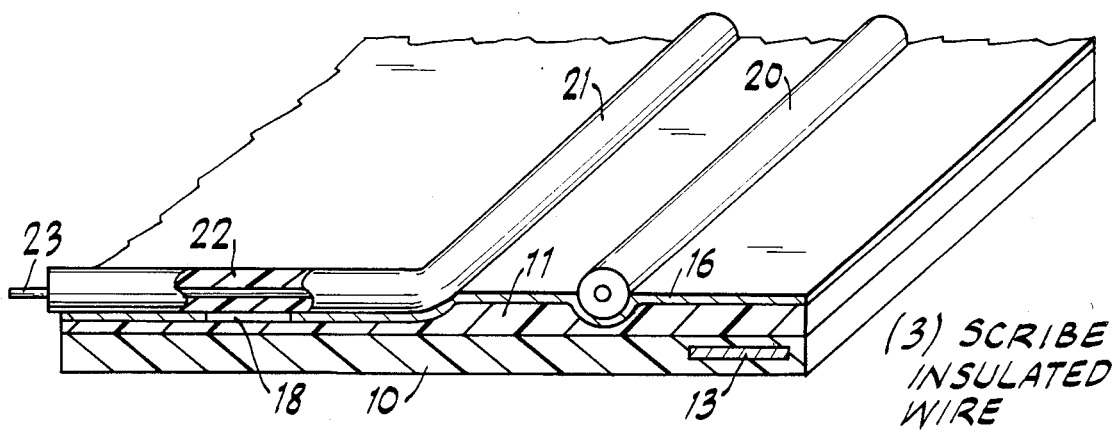
FIG. IC  (3) SCRIBE INSULATED WIRE

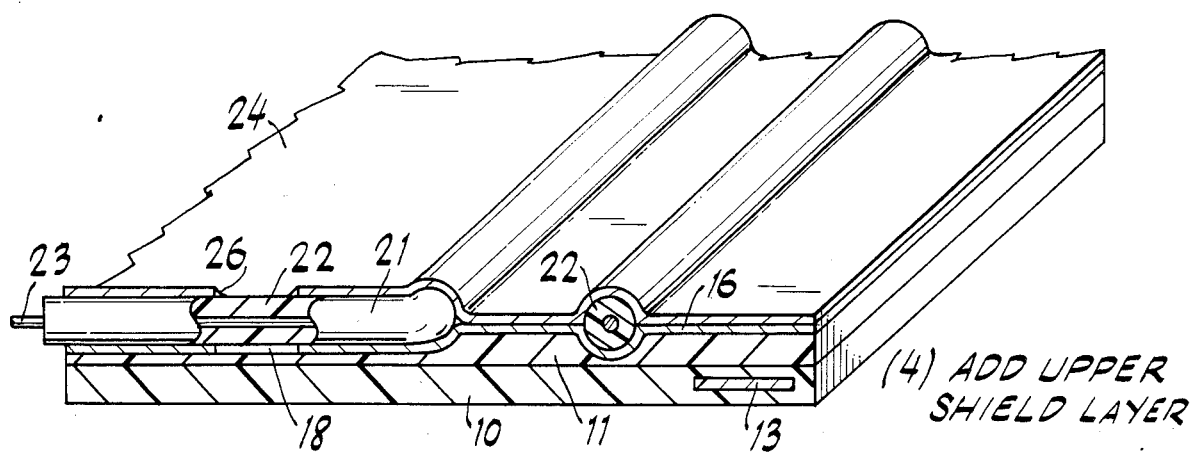
FIG. 1D  (4) ADD UPPER SHIELD LAYER
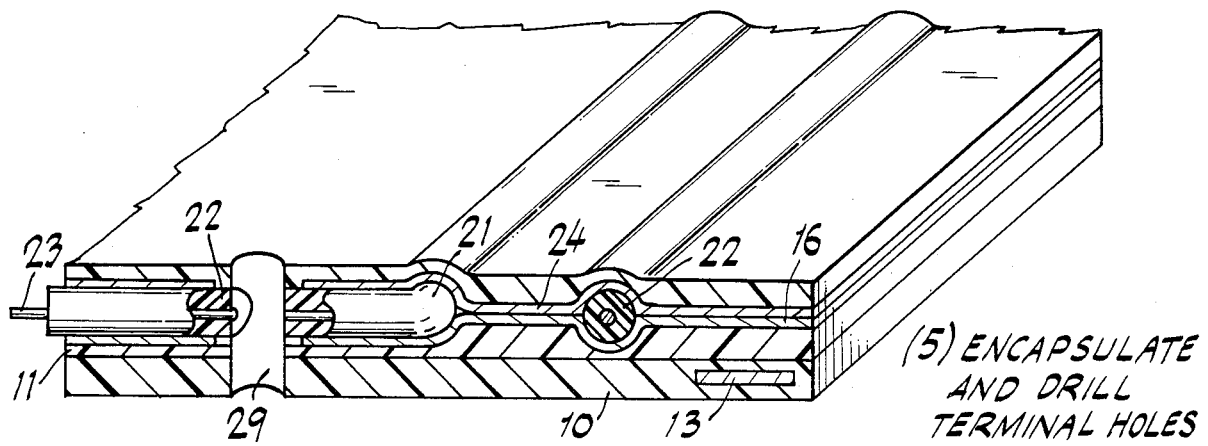
FIG. 1E  (5) ENCAPSULATE AND DRILL TERMINAL HOLES
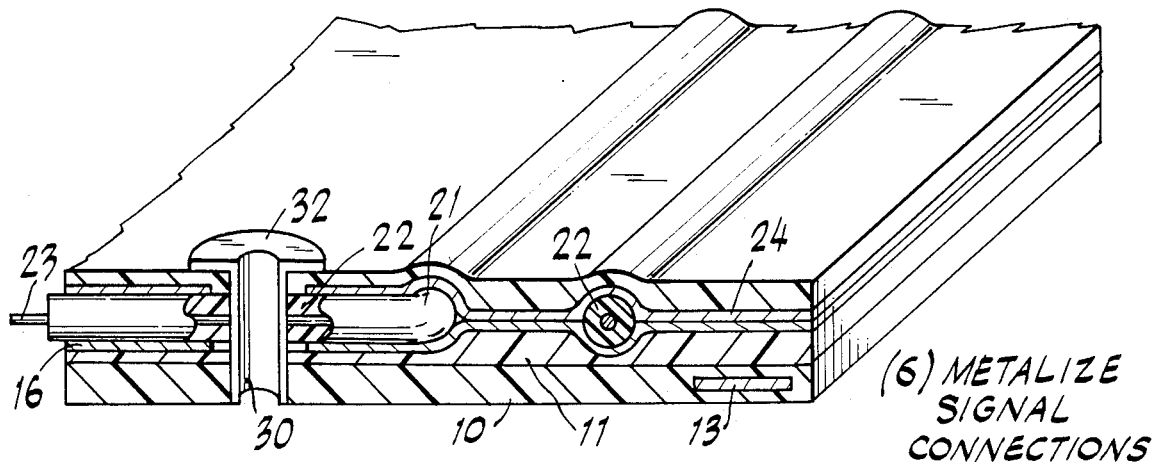
FIG. 1F  (6) METALIZE SIGNAL CONNECTIONS

SHIELDED INTERCONNECTION BOARDS

BACKGROUND OF THE INVENTION

This invention relates to a wire scribed circuit board product and method of manufacture. Specifically this invention relates to wire scribed circuit boards including shielded conductors.

As electronic components become smaller, and as the switching speeds of the components increase, the requirements on the interconnection circuit boards become increasingly severe and difficult to satisfy. The interconnection pattern becomes increasingly dense because of the smaller and more compact components. As the conductors move closer together to provide a denser pattern, however, the crosstalk and noise increases. Increased signal frequencies and higher switching speeds similarly tend to increase crosstalk and noise. At higher switching speeds and signal frequencies, the signal propagation speed in the transmission medium also becomes increasingly important since, for example, in high speed computer designs 50% of the computer cycle time is consumed in propagation delays.

Coaxial conductors are the preferred transmission medium for high frequency signals, particularly digital signals from high speed switching components. A coaxial conductor includes a central signal conductor surrounded by a dielectric which in turn is surrounded by a conductive shield. The shield surrounding the signal conductor retains all of the signal energy inside the coaxial conductor and isolates the signal conductor from the surrounding environment. The shield prevents radiation of energy from the signal conductor thereby reducing or eliminating electrical interference with other signals in vicinity.

Although coaxial conductors are the preferred interconnection medium, they are not widely used in electrical circuit boards because of the difficulty in incorporating such conductors in circuit boards made using automatic or semi automatic production techniques. In particular, difficulties are encountered in isolating the shield from the signal conductor so as to permit separate connections to other components.

Techniques are known for improving performance using conventional printed circuit boards or discrete wired boards. Generally, a minimum spacing is maintained between signal conductors to maintain crosstalk at tolerable levels. The components are located to minimize the length of the conductor runs and to avoid parallel runs of conductors sensitive to signal coupling. A technique known as striplining is also commonly used where conductive areas which do not carry signals are located above and below the signal conductors to provide partial shielding. These conductive areas are usually in the form of ground planes for power planes and can cover large areas or can be confined to specific areas overlying and/or underlying specific signal conductors.

SUMMARY OF THE INVENTION

An object of the present invention is to provide an interconnection circuit board with shielded signal conductors which can be formed in situ on the board. A particular advantage of the invention is the relative ease with which the shielded conductors can be created using a combination of conventional printed circuit and discrete wiring technology.

According to one embodiment of the invention, the board surface is first grooved according to a desired conductor pattern and the surface of the board is then plated with a conductive material to form the lower portion of the shields in the groove. Insulated wire is then scribed in the grooves and the board surface is then again plated to form the upper half of the shields by using mask and etch techniques. The shield conductors are not formed in, or are removed from, the terminal points to thereby form clearance areas. The circuit board is then encapsulated and drilled at the terminal points to expose to expose the ends of the signal conductors. The holes can then be metallized to bring the signal conductor terminations to the board surface. The insulation on the scribed conductor is preferably a low dielectric material such as polytetrafluoroethylene (TEFLON) which provides good transmission properties.

In an alternative technique according to the invention the circuit board is not grooved. An insulated wire pattern is scribed on to a planar adhesive coated surface of the board. The adhesive coating used to tack insulated conductor patterns on the board is such that at least half of the insulated conductor lies above the plane of the adhesive layer. The board is then overplated with a copper coating to provide a shield surrounding the upper portion of the conductors. Thus, shields are formed which substantially surround the signal conductor. In accordance with another embodiment of the invention the insulated wire conductor pattern is scribed on the copper plated surface of a board using a technique wherein the adhesive is applied to the wire rather than the board surface. When this scribed conductor pattern is overplated, the copper shielding completely surrounds the signal conductor.

BRIEF DESCRIPTION OF THE DRAWINGS

FIGS. 1A to 1F are a series of sequential illustrations showing a process for making shielded interconnection boards wherein the shielded conductors are formed in situ.

DETAILED DESCRIPTION OF THE INVENTION

Figure 2:
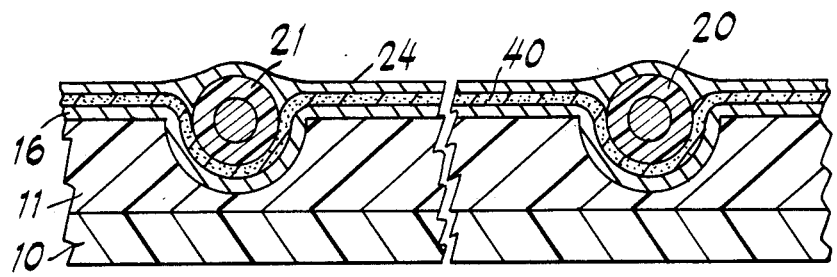
FIG. 2 is a cross-sectional view of a shielded interconnection board made according to the procedure shown in FIG. 1 wherein an adhesive layer is used.

FIGS. 1A through 1F illustrate the sequential steps used in creating a shielded circuit board according to the invention wherein the shielded conductors are created in situ with clearance areas at the signal conductor terminations.

The substrate 10 may be of any suitable material used in making circuit boards such as epoxy reinforced fiberglass. The substrate may include one or more interior conductive patterns 13 forming power planes, ground planes or interconnection conductors. An epoxy coating 11 covers the substrate surface and, for example, may be an epoxy mixture containing difunctional bisphenol A (EPON 828), trifunctional epoxy resin diluent (HELOXY 68), carboxy terminated acrylonitrile butadiene and pendant carboxyl groups (CTBNX), polyisobutyl acrylate flow parameter (MODA FLOW), Alumina trihydrate and a hardener, tris dimethylaminomethylphenol (DMP 30). Coating 11 provides a uniform coated layer suitable for laser grooving.

Grooves 12 and 14 are lased into the surface of coating 11. The board is preferably mounted on an X-Y table and moved at a controlled speed relative to a focussed laser beam. The laser beam is selected to produce energy absorbed by coating 11 such as a $CO_2$ laser providing a laser beam at a 10.6 micron wave length. The laser energy causes the coating to vaporize as the laser beam moves along the surface and thereby creates the grooves 12 and 14.

As shown in FIG. 1B, the grooved surface is next copper plated to provide a conductive surface 16 with nonplated clearance areas 18 located at the terminal points. The completed conductive surface in grooves 12 and 14 becomes the lower portion of the conductive shields of the shielded conductors. The board is prepared for plating by using a conventional cleaning bath which tends to roughen the surface to promote copper adhesion. The board is then electrically plated over the entire surface including the grooves. A suitable plating resist (such as Riston, a photoprintable plating resist from du Pont) is vacuum laminated on to the surface of the panel and photo activated in the clearance areas. The board is then placed in an etching solution to remove copper from the activated areas. As a result, the board surface is covered with copper except in selected areas 18 which are the clearance areas at the terminal points.

As illustrated in FIG. 1C, insulated wires 20 and 21 are next scribed on the surface of the grooved pattern. The insulated coating 22 is selected to achieve the desired dielectric characteristics for the coaxial conductor. Generally, a low dielectric is preferred in order to achieve high signal transmission speeds. A preferable insulating coating is polytetrafluoroethylene such as is available under the trademark TEFLON. TEFLON has a dielectric of about 2.0 and achieves coaxial transmission speeds of about 71% of the speed of light. The signal conductor 23 of the insulated wire is preferably copper having a diameter in the range of 0.0025 to 0.008 inches.

The insulated wire can be scribed using the procedure described in Pat. No. 3,671,914 wherein an adhesive is placed on the board surface and selectively activated to tack the wire in place on the board surface. A suitable adhesive is a polyamide (HIMOL) and butarol (BONDALL). The wire is applied to the surface by controlling board movement with an X-Y table while dispensing wire from a directionally controlled scribing head. The adhesive is preferably confined to the grooved areas. A preferred method of confining the adhesive to the grooved areas is described in patent application Ser. No. 756,690 filed 7-19-1985 "Apparatus For Making Scribed Circuit Boards and Circuit Board Modifications", B. E. Swiggett et al, wherein the adhesive is coated on the conductor rather than being coated on the board surface.

As shown in FIG. 1D the board is again plated after the insulated wires are in place so as to form the upper conductive shield for the coaxial conductors. The copper coating 24 is formed including a clearance area 26 overlying clearance area 18 in the region of the signal conductor termination. The procedure used for forming copper coating 24 and clearance area 26 is the same as that previously described for coating 16 and clearance area 18.

The board is next encapsulated as shown in FIG. 1E and then drilled at the terminal points as, for example, by hole 29 approximately at the center of clearance areas 18 and 26. The drilled hold exposes the end 28 of signal conductor 23. The holes can be drilled mechanically or can be formed by using a laser beam to ablate the polymeric materials without adversely affecting the copper signal conductor. The encapsulating material is preferably similar to that used in forming epoxy coating 11.

The interconnection board is completed as shown in FIG. 1F by metalizing hole 29 to provide a conductive coating 30 in the hole connecting signal conductor 23 to a terminal pad 32 on the surface of the board. Since clearance areas 18 and 26 were provided when the coaxial shields were formed, the conductive shields do not appear at the surface of hole 29 and therefore it is possible to connect signal conductor 23 to surface pad 32 by plating the surface of the hole without shorting to the conductive shield.

All of the conductive shields in the board are interconnected through ground planes formed by copper layers 16 and 24. These ground planes can be brought to surface terminations by using metalized holes (not shown).

FIG. 2 is a cross-sectional view of the interconnection board cut through a pair of insulated wire conductors 20 and 21. The shielded interconnection board is made using the procedure previously described in connection with FIGS. 1A-1F. In this structure the adhesive layer 40 completely coats the board surface and is used to adhere the insulated wire conductors in the grooves. The copper overplate layer 24 lies over the adhesive 40. The conductive shield formed by layers 16 and 24 substantially surrounds insulated conductors 20 and 21 to provide effective shields.

Figure 3:
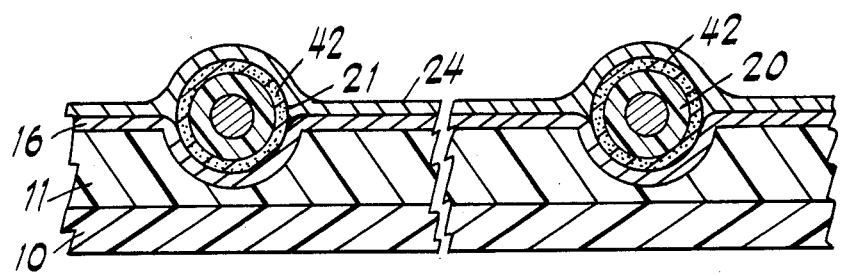
FIG. 3 is a cross-sectional view of a shielded interconnection board made according to the procedure shown in FIG. 1 using insulated conductors coated with adhesive.

FIG. 3 is a similar cross-sectional view showing a shielded interconnection board made using insulated wire coated with adhesive 42 in place of the adhesive layer. As can be seen in FIG. 3, the advantage of this structure is that the shield formed by layers 16 and 24 completely surrounds the conductors 20 and 21 to provide effective shielding.

Figure 4:
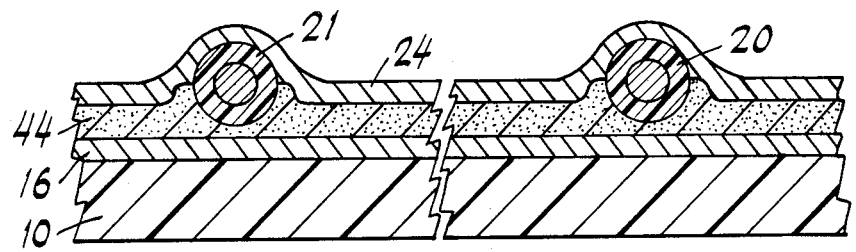
FIG. 4 is a cross-sectional view of a shielded interconnection board made without grooving the board surface.

FIG. 4 shows a cross-sectional view of a shield interconnection board made without grooving. Grooving is generally desirable to better fix the positions of the conductors on the board with a minimum of adhesive and to provide a better shield configuration surround the conductors. However, an effetive shield arrangement can be achieved as shown in FIG. 4 by forming the insulated wire conductive pattern on the planar surface of the conductive coating 16. The completed board is coated with an adhesive layer 14 and the insulated wires 20 and 21 are tacked into position in the adhesive. The board is thereafter overplated with coating 24 to form the upper portion of the shield structure. Adhesive layer 44 should be as thin as possible to achieve maximum exposure of the insulated wire above the plane of the adhesive. At least the upper half of the insulated wire conductor should be exposed. It is then possible for the copper plated layers 24 and 16 to substantially surround the insulated wire to provide an effective shield.

Figure 5:
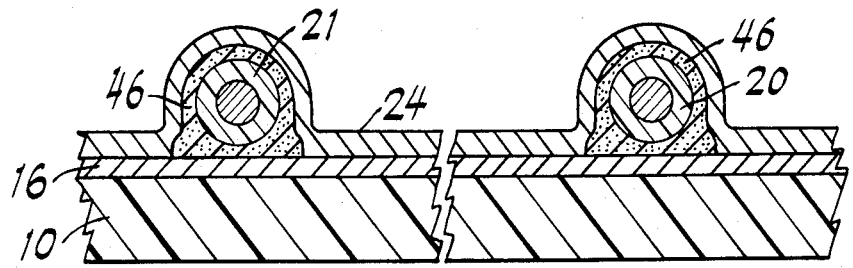
FIG. 5 is a cross-sectional view of a shielded interconnection board made without grooving the board and made using insulation wires coated with adhesive.

FIG. 5 shows another cross-sectional view of a shielded interconnection board made using wire precoated with adhesive. When the wire pattern is overcoated with layer 24, the conductive layers 16 and 24 completely surround the insulated wire to provide the effective shield.

In transmission lines such as formed by the shielded conductors, some forward crosstalk is normally evident because of the different dielectric constants of the materials surrounding the signal conductor. Since the signal propagation speed is a function of the dielectric constant, and since the wire insulation and the adhesive will normally have different dielectric constants, the signal tends to propagate at different speeds. This interference of the signal with itself due to the different propagation speeds is known as forward crosstalk. To minimize the forward crosstalk the adhesive should be selected having a low dielectric as close as possible to that of the insulation surround the signal conductor. The amount of adhesive should be of a minimum necessary to properly adhere the insulated wire to the board surface.

Backward crosstalk results from coupling between adjacent conductors and is largely a function of the degree to which the shield surrounds the signal conductor and isolates it from other conductors and components. Thus, in the arrangements where the conductive pattern is formed using an adhesive layer it is important that at least half the insulated conductor emerge above the plane of the adhesive so that the overcoated conductive layer will substantially surround the signal conductor.

The values for the forward and backward crosstalk, of course, depends on the specific structural arrangement and relationships to other components. As a general comparative index, however, the values for different transmission mediums are as follows:

|  | Characteristic Impedance | Backward Crosstalk | Forward Crosstalk |
| --- | --- | --- | --- |
| Non-shielded | 65–70 ohms | 8% | 5–6% |
| Stripline | 50 ohms | 5% | 15% |
| Shielded (invention) | 42 ohms | 0.5% | 3% |

Although specific embodiments have been described for making single sided coaxial interconnection boards, the techniques according to this invention are also applicable for making interconnection board with shielded conductors on both sides or interconnection boards with multi-layered shielded conductors.

The substrate on which the coaxial conductor pattern is formed may be plain, or may include interconnection conductors formed by discrete wiring, plating or etching. The substrate may also include ground planes, or power planes, either interior or on the surface. The substrate may also include surface conductors, terminal pads or terminal holes. The techniques utilized for signal conductor terminations may be used to bring the signal conductor terminations to the surface or to interconnect with other interior or surface conductors. Furthermore, additional interconnecting layers can be formed over the shielded conductor layers if desired.

In all of the embodiments the conductor shields are interconnected by a ground plane layer which may be either plated copper or a copper filled epoxy. Other techniques for forming conductive layers may also be employed.

The invention is more particularly defined in the appended claims.

We claim:

1. A method of making a coaxial conductor interconnection circuit board comprising;
   providing a first conductive coating on a surface of a substrate;
   scribing an insulated wire signal conductor pattern on said first conductive coating;
   providing a second conductive coating over said insulated wire;
   said first and second conductive coatings providing a conductive shield substantially surrounding said insulated wire conductors;
   eliminating conductive material in said first and second coatings in clearance areas at terminal points; and
   drilling at said terminal points to expose said signal conductor.

2. The method according to claim 1 wherein said drilling at said terminal points is by a laser beam.

3. The method according to claim 1 wherein said drilling at said terminal points is by mechanical drilling.

4. The method according to claims 2 or 3 wherein the hole formed by said drilling is metallized to bring said signal conductor termination to the surface of said circuit board.

5. The method according to claim 1 wherein said substrate is grooved prior to providing said first conductive coating and wherein said insulated wire signal conductors are scribed in said grooves after providing said first conductive coating covering said grooves.

6. The method according to claim 5 wherein said grooves are formed by laser grooving.

7. The method according to claim 1 wherein said clearance areas are formed by applying selectively activatable resist material over the conductive coating, by selectively activating said resist and by etching away said coating in said clearance areas.

8. The method according to claim 1 wherein said insulated wire includes an adhesive coating and wherein said adhesive coating is activated as said insulated wire is being scribed.

* * * * *